(12) United States Patent
Tai et al.

(10) Patent No.: US 6,612,535 B1
(45) Date of Patent: Sep. 2, 2003

(54) MEMS VALVE

(75) Inventors: Yu-Chong Tai, Pasadena, CA (US); Xing Yang, Pasadena, CA (US); Charles Grosjean, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/012,309

(22) Filed: Jan. 23, 1998

Related U.S. Application Data

(60) Provisional application No. 60/036,253, filed on Jan. 24, 1997.

(51) Int. Cl.[7] ............................................. F16K 31/02
(52) U.S. Cl. ...................... 251/11; 60/530; 251/129.01; 251/129.06
(58) Field of Search .................. 251/11, 129.01, 251/129.06; 60/527, 528, 529, 530

(56) References Cited

U.S. PATENT DOCUMENTS

| | | | | |
|---|---|---|---|---|
| 4,821,997 A | * | 4/1989 | Zdeblick .................. | 251/11 |
| 4,824,073 A | * | 4/1989 | Zdeblick .................. | 251/11 |
| 5,058,856 A | * | 10/1991 | Gordon et al. ............ | 251/11 |
| 5,161,774 A | * | 11/1992 | Engelsdorf et al. ........ | 251/11 |
| 5,271,597 A | * | 12/1993 | Jerman .................... | 251/11 |
| 5,271,724 A | * | 12/1993 | Van Lintel ............. | 251/129.06 |
| 5,323,999 A | * | 6/1994 | Bonne et al. ............. | 251/11 |
| 5,333,831 A | * | 8/1994 | Barth et al. ............... | 251/11 |
| 5,529,279 A | * | 6/1996 | Beatty et al. ............. | 251/11 |
| 5,681,024 A | * | 10/1997 | Lisec et al. .............. | 251/11 |
| 5,785,295 A | * | 7/1998 | Tsai ....................... | 251/11 |

FOREIGN PATENT DOCUMENTS

| | | |
|---|---|---|
| WO | WO 95/08716 | 3/1995 |
| WO | 97/01055 | 1/1997 |

OTHER PUBLICATIONS

Xing Yang et al., "A MEMS thermopneumatic silicone rubber membrane valve", Sensors and Actuators Elsevier Science S.A., vol. 64, No. 1, Jan. 1, 1998, pp. 101–108.

* cited by examiner

*Primary Examiner*—George L. Walton
(74) *Attorney, Agent, or Firm*—Fish & Richardson P.C.

(57) ABSTRACT

A valve where the valve membrane is made from silicone rubber. Preferably the valve is a microelectromechanical systems (MEMS) thermopneumatic valve. Because of the advantageous physical properties of silicone rubber, the valve provides desirable performance with reasonable power consumption.

8 Claims, 6 Drawing Sheets

VALVE TESTING APPARATUS

(a) Nitride Depostion (b) Backside etching (c) Silicone Rubber (d) Nitride Removal (a) KOH etching (d) Patterning (b) Nitride Deposition (e) BrF$_3$ Release (c) Silicone Rubber (f) Nitride Revoval

MEMS VALVE

This application claims the benefit of U.S. Provisional Application No. 60/036,253, filed Jan. 24, 1997.

The U.S. Government may have certain rights to this invention under the terms of Grant No. N66001-96-C-8632 awarded by the U.S. Navy. Accordingly, the U.S. government has certain rights in this invention.

TECHNICAL FIELD

The present invention relates to valves, and in particular to microelectromechanical systems (MEMS) thermopneumatic valves.

BACKGROUND OF THE INVENTION

Micromachined valves are known. Many of these valves have used high modulus materials such as silicon or metal for the valve membrane due to process and integration issues.

Silicon membranes have limited realizable deflections. Accordingly, many microvalves using silicon membranes are restricted to low flow applications unless very large membranes are used. These valves have needed to generate a significant amount of force to deflect the silicon membrane properly.

SUMMARY OF THE INVENTION

The present invention provides a technology for fabricating valve membranes from silicone rubber. These valve membranes are integrated with other processes on a silicon wafer.

Silicone rubber is rubber made from silicone elastomers. This material has multiple desirable mechanical properties. The inventors found that silicone rubber exhibits a very low modulus of about 1 MPA, good compatibility with IC processes, high elongation, and good sealing properties on rough surfaces.

Small membranes fabricated with silicone rubber can be deflected with a minimum of force. This property results in reduced dead volume and lower power operation of the valve. In addition, due to the high elongation, it is possible to make actuators with millimeter scale vertical displacement The preferred material is MRTV1™ (produced by American Safety Technologies™). This material has high elongation and low durometer which results in good sealing. An integrated normally open valve using a silicone rubber membrane and 3M™PF5060™ liquid for thermopneumatic actuation has been fabricated. For an air flow of about 1.3 1pm, about 280 mW is required to close the valve at an inlet pressure of about 20 psi.

DETAILED DESCRIPTION OF THE INVENTION

Figure 1:
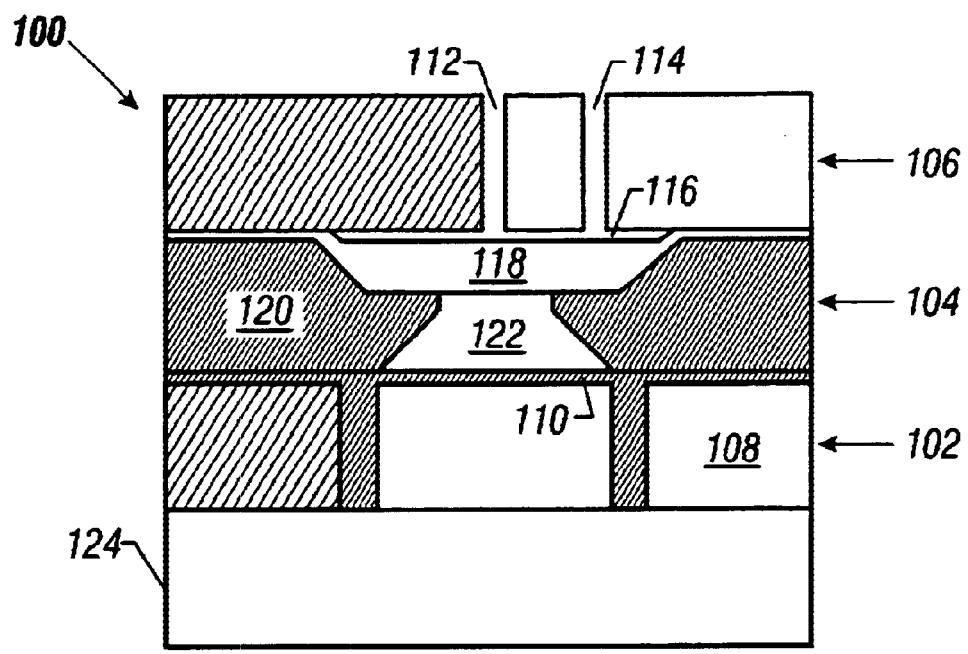
FIG. 1 shows a cross section of a preferred embodiment of a valve.

A preferred embodiment of a valve 100 according to the present invention is shown in FIG. 1. The preferred embodiment preferably includes three parts: an actuator 102, a valve membrane chip 104, and a valve seat 106.

A heater chip 110 acts as an actuator 102 for the valve 100. The preferred heater chip 110 is a resistive heater. The heater chip 110 is preferably fabricated on a layer of Pyrex glass 108. Pyrex glass is preferred rather than regular glass due to the lower thermal conductivity of Pyrex versus regular glass: 0.1 W/m–° C. for Pyrex glass, and 1 W/m–° C. for regular glass. A layer of 10 nm Cr/700 nm Au is evaporated and patterned. The actuator 102 is affixed to the valve membrane chip 104, described below.

Figure 5:
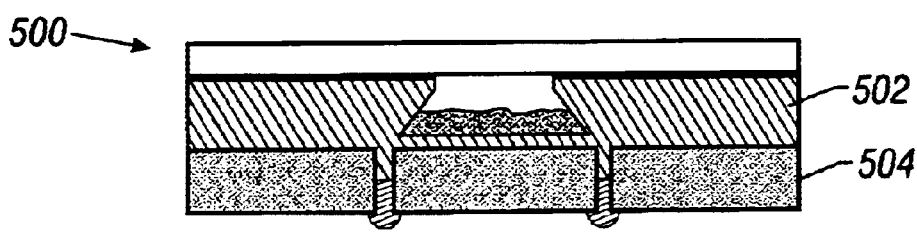
FIG. 5 illustrates an assembled simple valve.

A simple valve is useful to demonstrate the desirable qualities of silicone rubber as a preferred material for use as a valve membrane in valves according to the present invention. In addition, the fabrication process for the simple valve illustrates some of the steps in the fabrication of preferred embodiments. As shown in FIG. 5, this simple valve 500 includes the simple valve membrane chip 502 and an actuator 504. FIGS. 2A to 2D show a fabrication process for a simple membrane chip to be used.

Figure 2A:
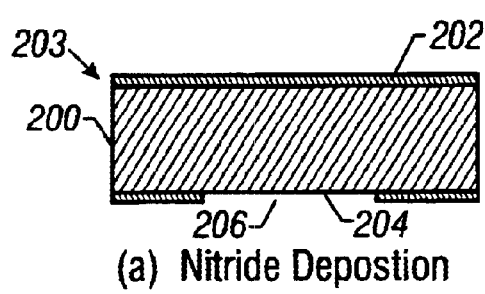
FIGS. 2A to 2D illustrate a simplified process flow for fabricating a simple valve chip.
Figure 2B:
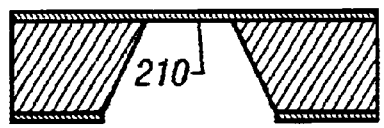
Figure 2C:
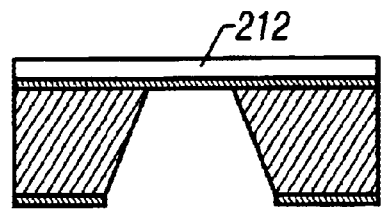
Figure 2D:
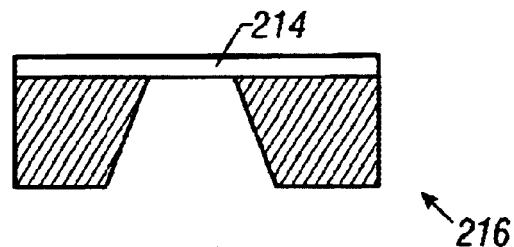

In FIG. 2A, a simple valve membrane chip (216 in FIG. 2D) is fabricated on a <100> silicon wafer 200, preferably about 500 μm thick. Other semiconductor materials such as germanium could alternately be used. A 1 μm low-stress low pressure chemical vapor deposition ("LPCVD") silicon nitride film 202 is deposited on the wafer 200. The silicon nitride 202 on the back side 204 of the wafer 200 is patterned with windows 206 measuring about 3 mm×3 mm using $SF_6/O_2$ plasma. In FIG. 2B, potassium hydroxide (KOH) is used to etch through the back side 204 of the wafer 200 to reach the nitride 202 on the front side 208 of the wafer 200. This forms silicon nitride membranes 210 measuring about 2.3 mm×2.3 mm. In FIG. 2C, silicone rubber, such as MRTV1™, is spincoated on the silicon nitride 202 on the front side 208 of the wafer 200 forming a silicone rubber layer 212 which is preferably about 132 μm thick. The silicone rubber 212 is then cured at room temperature for about 24 hours. In FIG. 2D, The silicon nitride membranes 210 are removed using $SF_6/O_2$ plasma leaving free silicone rubber membranes 214, completing the simple valve membrane chip 216.

An actuator, as described above, is then affixed to the simple valve membrane chip (preferably with epoxy) to form the simple valve. The functionality of the simple valve is described later in the disclosure.

Figure 3A:
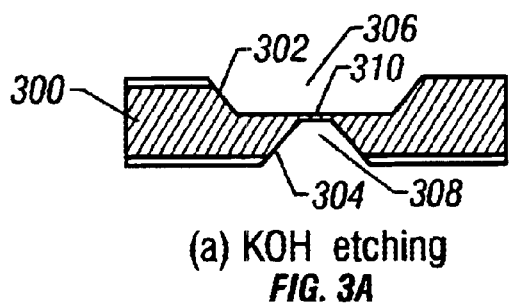
FIGS. 3A to 3F illustrates a process flow for fabricating a valve membrane chip.
Figure 3D:
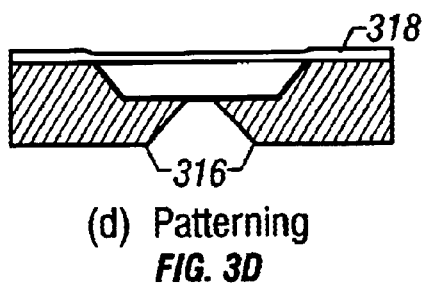
Figure 3B:
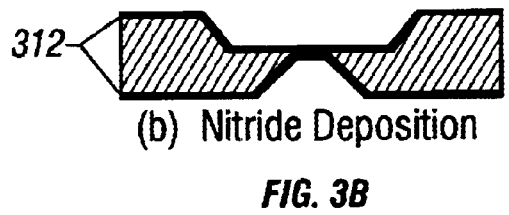

In a preferred embodiment of a valve, as discussed above, a valve membrane chip is used. A preferred process flow for fabricating the valve membrane chip is shown in FIGS. 3A to 3F. A <100> wafer 300 is preferably made of silicon and is preferably about 520 μm thick. In FIG. 3A, the wafer 300 is oxidized and patterned on both its upper surface 302 and lower surface 304 using a KOH etchant to form two cavities 306, 308. The wafer 300 is etched about 235 μm with KOH on each side leaving a silicon membrane 310 about 50 μm thick between the upper cavity 306 and the lower cavity 308. The upper cavity 306 is preferably about 4.8 mm×5.8 mm and later serves as a mold for silicone rubber. The upper surface of the lower cavity 308 defines the dimensions of the silicon membrane 310 which is preferably about 1.5 mm×2.5 mm. The lower cavity 308 will later serve as a reservoir for actuator liquid. In FIG. 3B, a layer of low-stress silicon nitride 312 about 0.5 μm thick is deposited on both sides 302, 304 of the wafer 300.

Figure 3E:
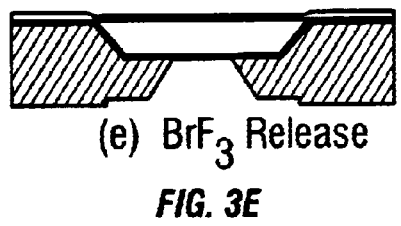
Figure 3C:
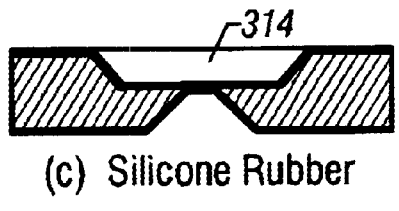
Figure 3F:
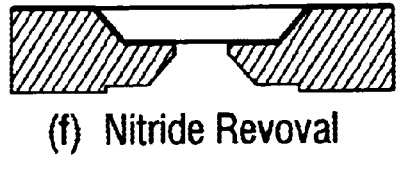

In FIG. 3C, silicone rubber, such as MRTV1™, is molded into the upper cavity 306 forming a silicone rubber valve membrane 314. In FIG. 3D, the silicon nitride layer 312 on the lower surface 304 of the wafer 300 is patterned using $SF_6/O_2$ plasma to remove the silicon nitride 312 over the silicon membrane 310 and to define two openings 316 that will provide clearance when adding actuator liquid to the assembled valve. Photoresist and silicon nitride 318 are deposited on the silicon nitride 312 on the front side 302 of the wafer 300 and the silicone rubber valve membrane 314. In FIG. 3E, the silicon membrane 310 and the openings 316 are etched using $BrF_3$ vapor while the remainder of the wafer is protected with the photoresist and silicon nitride 318. Finally, in FIG. 3F, the silicon nitride 312 underneath the silicone rubber valve membrane 314 is stripped. Once the silicone rubber valve membrane 314 is exposed on both sides, the valve membrane chip 320 is complete. While silicone rubber is the preferred material for the valve membrane, alternate materials with similar physical properties may also be used.

Returning to FIG. 1, the valve seat 106 is preferably fabricated from Corning™ 2947 glass. An inlet hole 112 and outlet hole 114 are mechanically drilled and 500 μm i.d. fused silica capillaries are glued to the glass with epoxy. A gap 116 between the valve seat 106 and the silicone rubber valve membrane 118 (314 in FIG. 3F) of the valve membrane chip 102 is defined by the curvature of the front surface of the silicone rubber valve membrane. The gap 116 is preferably about 60 to 70 μm.

The valve 100 is assembled by affixing the valve seat 106 and actuator 102 to the valve membrane chip 104, preferably with epoxy. The recessed nature of the silicone rubber valve membrane 118 allows the use of standard glues as the valve seat 106 only contacts the silicon surface of the valve membrane chip 104. In contrast, many previous designs typically required the use of silicon glue to assemble the valve as adhesion of most glues to silicone rubber is poor. After the epoxy cures, a cavity 120 (the lower cavity 308 of FIG. 3F) between the actuator 102 and the back side of the valve membrane chip 104 is filled with an actuator liquid 122 and sealed with a backing plate 124. The actuator liquid 122 is preferably alcohol or PF5060™. The backing plate 124 is preferably made of Pyrex.

As noted above, American Safety Technologies™ MRTV1™ is a preferred material for the valve membrane 118. MRTV1™ is an addition cure mold making RTV (room temperature vulcanizing) silicone rubber. The physical properties are shown in Table 1:

TABLE 1

| Mixed Viscosity, cps | 60,000 |
| Hardness, Durometer | Shore A 24 |
| Tensile Strength, psi | 500 |
| Tear Strength, Die B lb/in | 125 |

TABLE 1-continued

| Tensile Elongation, % | 1,000 |
| Temperature Range, ° C. | −55 to 200 |
| Thermal Conductivity, W/cm-° C. | 0.002 |
| Dielectric Strength, volts/mil | 550 |
| Volume Resistivity, ohm-cm | $1.6 \times 10^{15}$ |
| Temperature Range, ° C. | −55 to 200 |

MRTV1™ exhibits excellent adhesion to silicon and silicon nitride due to the presence of silane groups in the formulation. MRTV1™ is resistant to buffered hydrofluoric acid, positive photoresist developer, alcohol, and oxygen plasma for short periods of time. This resistance simplifies processes where MRTV1™ is used.

Long term exposure of silicone rubber to certain materials including strong acids, organic solvents such as acetone, and strong alkalis may damage the material. Hence, such contact should be avoided. The etch rate of $CF_4$ plasma for silicone rubber is similar to that for silicon dioxide. Adhesion to photoresist and most glues for silicone rubber is typically very poor. Thin silicone rubber films are sometimes permeable to various chemical vapors and absorb some liquids.

Figure 4:
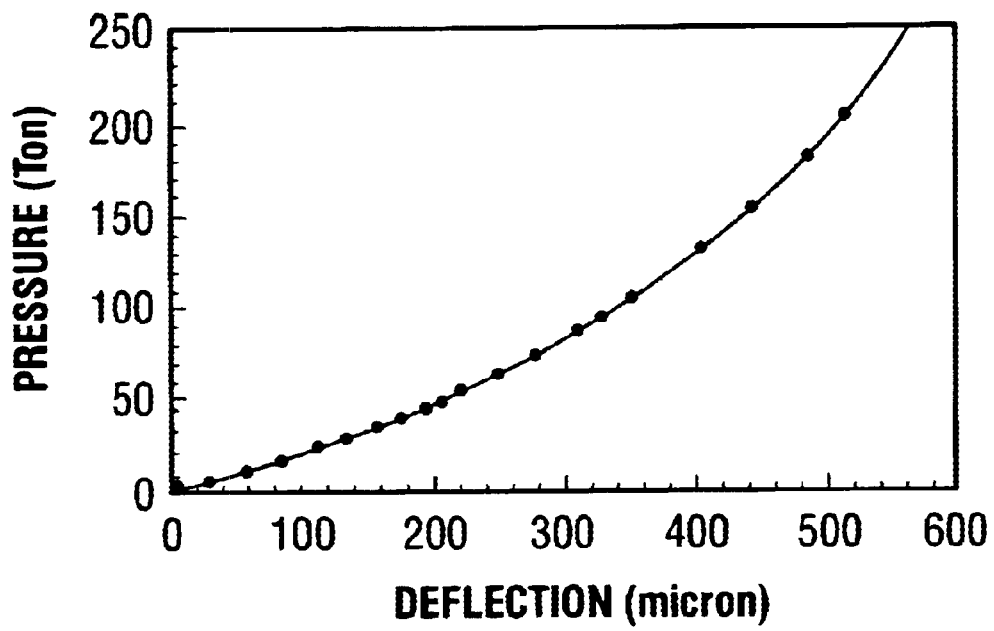
FIG. 4 is a chart showing pressure versus deflection with fit.

By way of example, load-deflection tests were performed on a simple valve made according to the process described above (in FIGS. 2A to 2D). FIG. 4 shows the measurement data of Young's modulus and residual stress for a silicone rubber membrane measuring approximately 2.3 mm×2.3 mm×132 μm. Assuming the Poisson's ratio of silicone rubber is 0.5, the construction results in E=0.51 MPa and d=0.08 MPa. At about 14.6 psi, the silicone rubber membrane deflects about 1.54 mm. This corresponds approximately to a 115% increase in surface area. At this high pressure, the membrane has plastically deformed. Since the design goal for the gap in the preferred valve is less than 100 μm, plastic deformation is generally not a concern.

Typically, it is most convenient to spin coat wafers with silicone because most silicones are too viscous to spray. However, MRTV1™ is sufficiently viscous at 60,000 cps that uniform spin coating is difficult. Slow speeds often result in uneven films while higher speeds streak, bubble, and redistribute fillers nonuniformly. Other silicones such as GERTV615™ may spin coat very well, but lack the desirable properties of MRTV1™. Molding the silicone into cavities formed in the wafer works very well and produces uniform films die to die. Accordingly, molding is the preferred method of introducing silicone rubber to the cavity.

Many liquids used for thermopneumatic actuation (such as alcohol) typically escape from a sealed valve or actuator as vapor in a matter of days. While this is endemic of silicone in general, it is further exacerbated by the use of thin layers. Using a composite membrane with a sealing film between the liquid and silicone rubber solves this problem.

The present invention provides a method for fabricating silicone membranes and integrating them with micromachined components to make actuators and valves. Silicone rubber has been found to have many desirable properties including high elongation, good scaling, low modulus of elasticity, and compatibility with IC processes. In addition, as an example of practical implementation a thermopneumatically actuated valve has been successfully constructed according to the present invention. Using this valve, 280 mW was sufficient power to close a 1.3 1pm air flow at 20 psi.

Testing

A simple membrane chip and a heater are assembled to form a simple thermopneumatic actuator as shown in FIG.

Figure 6A:
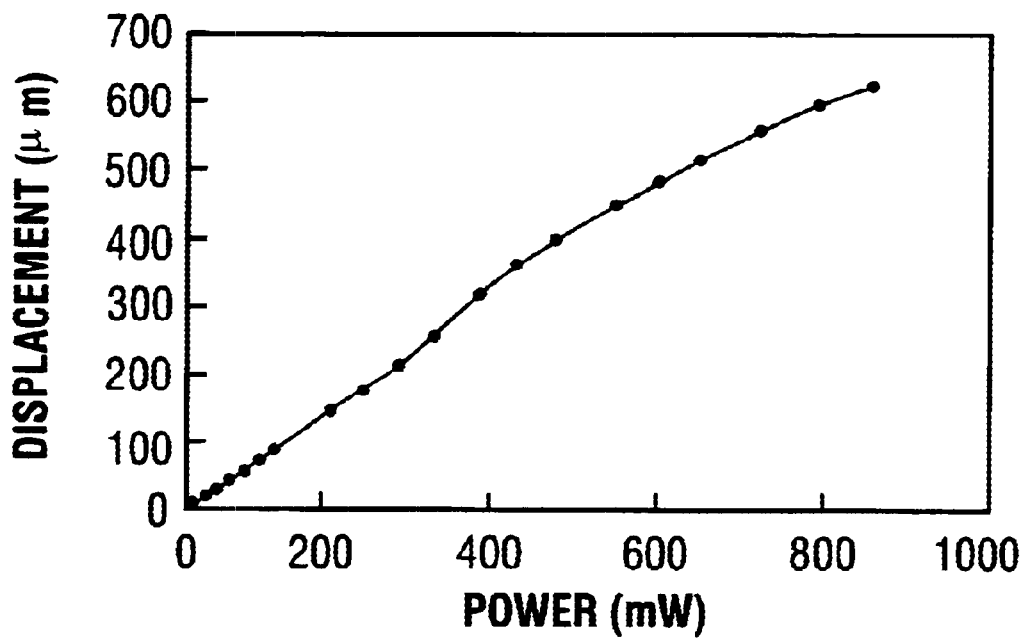
FIG. 6A is a chart showing deflection of a silicone membrane versus power when using alcohol as an actuator liquid.
Figure 6B:
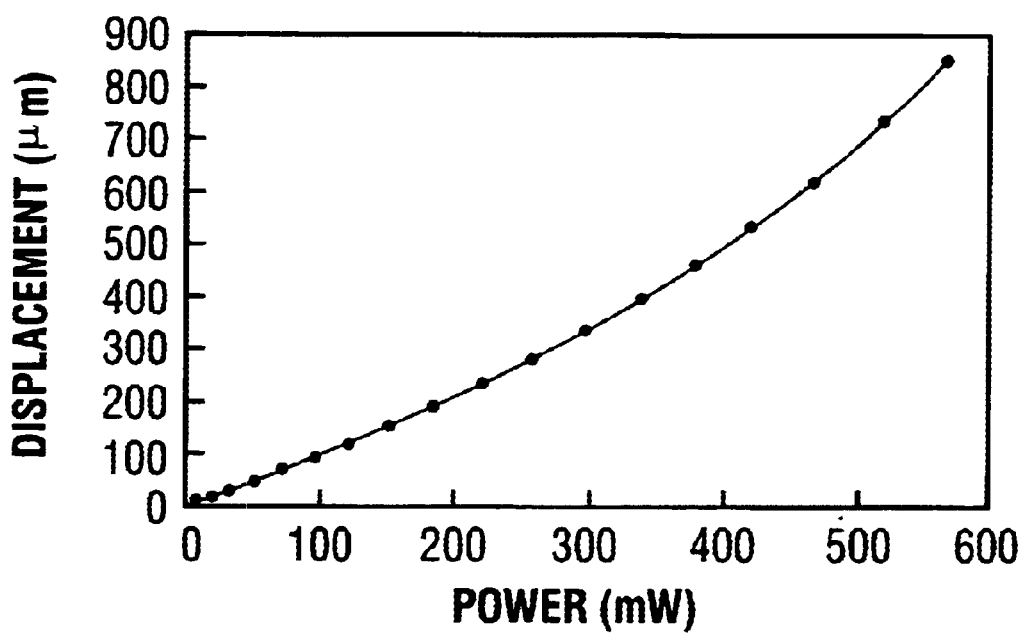
FIG. 6B is a chart showing deflection of a silicone membrane versus power when using PF5060™ as an actuator liquid.

9. A calibrated microscope is used to measure vertical displacement. Since the volume of the heater/membrane assembly changes significantly during operation, a gas/liquid system for thermopneumatic actuation is used for greater efficiency. The actuator liquid is chosen to be compatible with silicone rubber and the resistive heater. Isopropanol™ and 3M™ Performance Fluids™ (industrial versions of Fluorinert™) are used, due to their better ratio of vapor pressure to temperature as compared to water. The cavity formed by the simple membrane and heater dice is filled with a small amount of liquid (about 10 to 20%) and sealed. Actuation is observed by applying a fixed amount of power and measuring deflection of the membrane from its rest position. FIG. 6A shows the results for alcohol, and FIG. 6B shows the results for PF5060™ as the actuator liquid. With alcohol as the actuator liquid, the membrane deflects about 620 $\mu$m at about 0.87 W power input which corresponds to about 5 psi. Using PF5060™, the membrane deflects about 860 $\mu$m at about 0.94 W power input which corresponds to about 7 psi. These results confirm that silicone rubber membranes with a liquid/gas system can deliver large deflection with reasonable power consumption.

Figure 7:
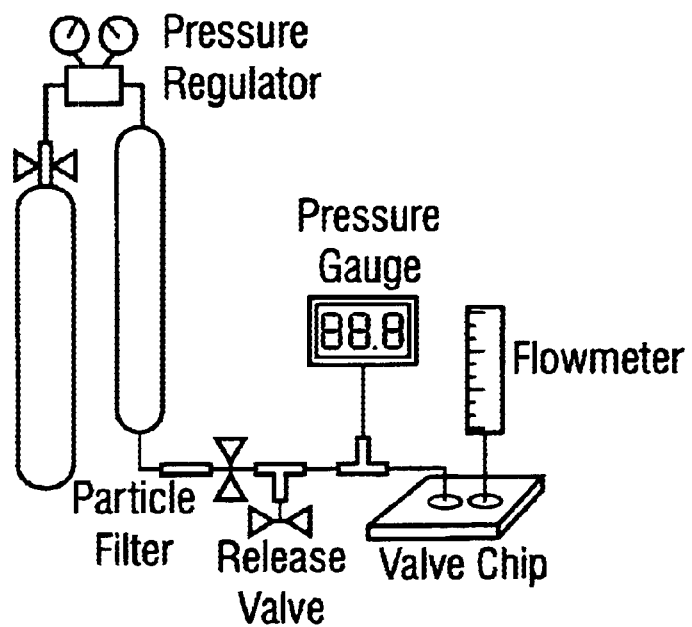
FIG. 7 shows a valve testing apparatus.
Figure 8A:
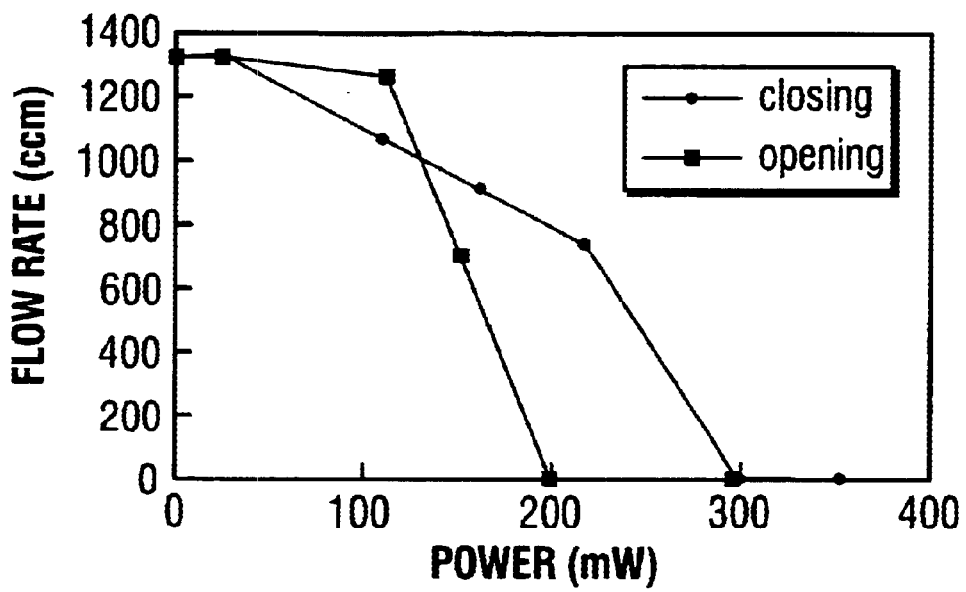
FIG. 8A is a chart showing valve performance when pressure at the inlet is 20 psi.
Figure 8B:
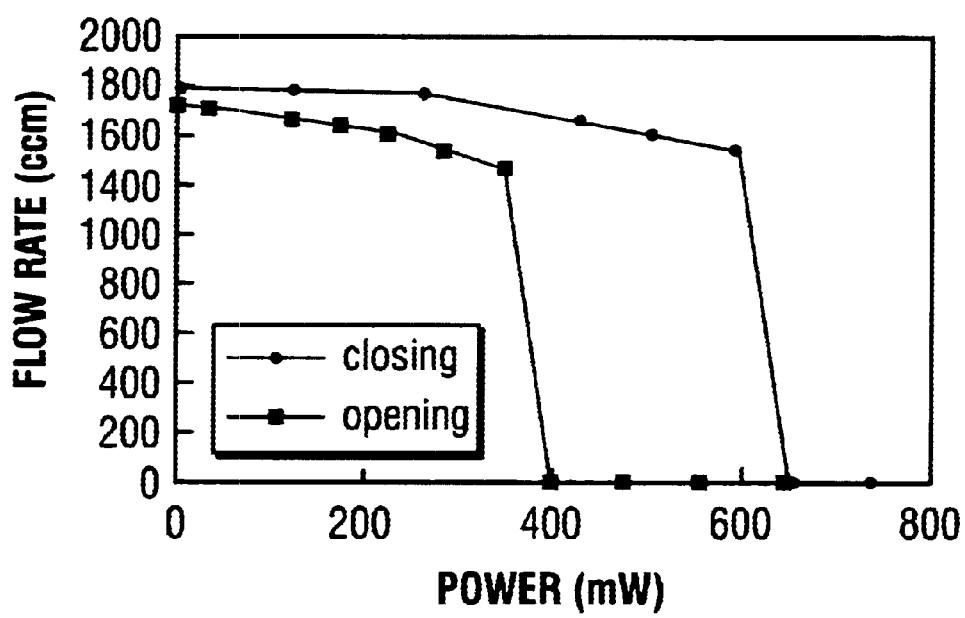
FIG. 8B is a chart showing valve performance when pressure at the inlet is 30 psi.

A preferred valve according to the present invention (as shown in FIG. 1 and FIGS. 3A to 3F) is tested using the setup shown in FIG. 7. A pressure sensor is used to measure inlet pressure and a flow meter is used to measure output flow. A reservoir and pressure regulator provide a reasonably constant flow of compressed air to the valve inlet. The valve is tested at two different inlet pressures. One minute is given between successive data points to allow the valve to warm up or cool down. 3M™ PF5060™ is used as the actuator fluid. Because the deflection of the silicone rubber membrane is limited to about 70 $\mu$m in the mechanical design of the preferred embodiment, large displacements are not always necessary. The volume of the cavity/membrane system does not change significantly so the cavity is filled to about 80 to 90% capacity with actuator liquid for better performance. At room temperature, PF5060™ has a vapor pressure of about 4 psi. Hence, the inlet pressure must be higher than about 3 psi for proper valve operation as about one psi is required to deflect the membrane to the valve seat. FIG. 8A shows valve operation at about 20 psi inlet pressure. With a power input of about 280 mW, the valve shuts off the flow of about 1340 ccm/min. FIG. 8B shows the same valve operated at about 30 psi. At about 30 psi, the valve shuts off the flow of about 1790 ccm/min with a power input of about 650 mW. Both figures illustrate that the valve shows a certain degree of hysteresis. The most likely cause of this is the need to heat up the substrate when closing the valve. Once up to temperature, it takes less power to keep the membrane deflected and the heat storage of the substrate keeps the valve closed longer. Alternative substrate materials with lower thermal conductivity might improve performance.

While a preferred embodiment of the present invention has been described, the present invention is not limited to that embodiment, but rather includes any embodiment which falls within the scope of the following claims.

What is claimed is:

1. A microelectronic valve comprising:
    a first substrate defining an inlet part, an outlet part and a channel cavity extending between said inlet part and said outlet part with a valve seat in said channel cavity at a location allowing sealing between said inlet and outlet;
    a valve membrane formed of silicone rubber coupled within said channel cavity; and
    a valve actuator, coupled to said first substrate, including a heater and a fluid, which fluid is heated when actuated to expand to expand and press against said valve seat.

2. A valve as in claim 1, wherein said elastomeric valve element expands to block an entirety of both said inlet part and said outlet part.

3. A microelectronic valve membrane chip comprising:
    a wafer;
    a first cavity defined in the wafer;
    a second cavity defined in the wafer;
    an aperture between the first cavity and the second cavity;
    a valve membrane formed of silicone rubber, and at least partially occupying the aperture such that a gap remains between a plane formed by a front surface of the valve membrane and said first and second cavities;
    a thermopneumatic actuator coupled to the back side of the wafer, said actuator configured to produce heat on energization provide actuation for said valve membrane;
    an actuator fluid disposed in contact with said valve membrane, said actuator fluid operating to provide an appropriate thermal condition desired for actuator operation,
    said valve membrane being expanded when said fluid is at said appropriate thermal condition, to completely occupy the aperture and to close said gap; and
    a third cavity, defined in said wafer, also holding said actuator fluid.

4. The MEMS valve membrane chip of claim 3 where the valve membrane is made from silicone rubber.

5. The MEMS valve membrane chip of claim 3 where the valve membrane is a composite membrane comprising a sealing film between the second cavity and the silicone rubber.

6. A valve, comprising:
    a first substrate portion, including to a top substrate surface and a bottom substrate surface, and a first and second channels extending between said top substrate surface and said bottom substrate surface;
    a second substrate portion, including an elastomeric valve element, which, when in an un stretched state, occupies a portion below the bottom substrate surface, leaving a channel between said first and second channels along said bottom substrate surface;
    a third substrate portion, including an expandable fluid, and an actuator which is selectively actuatable to expand said expandable fluid, said expandable fluid occupying a portion adjacent said elastomeric valve element and expanding said valve element to block said portion between said first and second channels, by pressing against said bottom substrate surface.

7. A valve as in claim 6, wherein said the third substrate portion includes a first cavity, and at least one downwardly expanding channel, forming a reservoir for said expandable fluid.

8. A valve as in claim 6, wherein said elastomeric valve element expands to block an entirety of both said first and second channels against said bottom substrate surface.

* * * * *